(12) United States Patent
Xu et al.

(10) Patent No.: US 12,550,776 B2
(45) Date of Patent: Feb. 10, 2026

(54) CHIP PACKAGING STRUCTURE AND CHIP PACKAGING METHOD

(71) Applicant: JCET Advanced Packaging Co., LTD., Wuxi (CN)

(72) Inventors: Hong Xu, Wuxi (CN); Dong Chen, Wuxi (CN); Xia Xu, Wuxi (CN); Dou Jin, Wuxi (CN); Jinhui Chen, Wuxi (CN)

(73) Assignee: JCET ADVANCED PACKAGING CO., LTD., Wuxi (CN)

( * ) Notice: Subject to any disclaimer, the term of this patent is extended or adjusted under 35 U.S.C. 154(b) by 677 days.

(21) Appl. No.: 17/893,154

(22) Filed: Aug. 22, 2022

(65) Prior Publication Data
US 2023/0068875 A1 Mar. 2, 2023

(30) Foreign Application Priority Data
Aug. 25, 2021 (CN) .......................... 202110983730.8

(51) Int. Cl.
*H01L 23/31* (2006.01)
*H01L 21/56* (2006.01)
*H01L 23/00* (2006.01)

(52) U.S. Cl.
CPC ........ *H01L 23/3107* (2013.01); *H01L 21/561* (2013.01); *H01L 21/568* (2013.01); *H01L 23/3171* (2013.01); *H01L 24/05* (2013.01); *H01L 24/13* (2013.01); *H01L 24/96* (2013.01); *H01L 2224/0401* (2013.01);
(Continued)

(58) Field of Classification Search
CPC . H01L 23/3107; H01L 21/561; H01L 21/568; H01L 23/3171; H01L 24/05; H01L 24/13; H01L 24/96; H01L 2224/0401; H01L 2224/05599; H01L 2224/131; H01L 2224/96; H01L 23/3114
See application file for complete search history.

(56) References Cited

U.S. PATENT DOCUMENTS

| 2010/0078834 A1* | 4/2010 | Bathan | H01L 23/562 |
| | | | 438/121 |
| 2017/0033026 A1* | 2/2017 | Ho | H01L 23/49827 |
| 2019/0267287 A1* | 8/2019 | Hariharan | H01L 23/562 |

(Continued)

FOREIGN PATENT DOCUMENTS

| CN | 102931094 A | 2/2013 |
| CN | 106531700 A | 3/2017 |

(Continued)

*Primary Examiner* — Eliseo Ramos Feliciano
*Assistant Examiner* — Thaddeus J Kolb
(74) *Attorney, Agent, or Firm* — MUNCY, GEISSLER, OLDS & LOWE, P.C.

(57) ABSTRACT

The present invention provides a chip packaging structure and a chip packaging method. Compared with an existing method of joining an encapsulation layer with a dielectric layer, adhesion between the encapsulation layer and a chip in the present invention is increased, and the encapsulation layer is less likely to fall off under stress. Furthermore, during the packaging process, a passivation layer enables chips to be mutually fixed together, which can prevent the chips from being shifted during the encapsulation process, and thereby enhance the reliability of the final product and improve the yield of the final product.

12 Claims, 5 Drawing Sheets

(52) U.S. Cl.
CPC .............. *H01L 2224/05599* (2013.01); *H01L 2224/131* (2013.01); *H01L 2224/96* (2013.01)

(56) References Cited

U.S. PATENT DOCUMENTS

| | | | | |
|---|---|---|---|---|
| 2020/0006220 | A1* | 1/2020 | Pan | H01L 24/29 |
| 2020/0006241 | A1* | 1/2020 | Wu | H01L 24/32 |
| 2021/0057300 | A1* | 2/2021 | You | H01L 21/6835 |
| 2022/0351901 | A1* | 11/2022 | Newlin | H01L 23/3121 |
| 2022/0392863 | A1* | 12/2022 | Bellizzi | H01L 23/3121 |

FOREIGN PATENT DOCUMENTS

| | | |
|---|---|---|
| CN | 106952884 A | 7/2017 |
| CN | 215680665 U | 1/2022 |

\* cited by examiner

CHIP PACKAGING STRUCTURE AND CHIP PACKAGING METHOD

TECHNICAL FIELD

The present invention relates to the field of semiconductor packaging technologies, and in particular to a chip packaging structure and chip packaging method.

BACKGROUND

In conventional methods for packaging a chip packaging structure from four sides or five sides, a trench is generally formed on a wafer by using dry etching method and so on. Then, the trench may divide the wafer into several individual chips, and a passivation layer in the trench is completely etched. That is, a bottom of the trench may extend to a dielectric layer, such that the chip fails to be well fixed. Consequently, in the subsequent process of forming an encapsulation layer covering a sidewall and a back side of the chip by molding encapsulation material or laminated encapsulated film, the chip may be displaced due to a great force, resulting in a difficulty or even a failure of alignment in the subsequent process.

Meanwhile, the formed encapsulation layer is joined to the dielectric layer at an end approximate to the front side of the wafer. However, the material of the encapsulation layer is an epoxy resin encapsulation material, and the dielectric layer is polyimide or phenolic resin photoresist (at a low or high temperature). As well known, gaps exist between polymer chain segments as cross-linked together in the dielectric layer, such that the photoresist exposed to the air is easy to absorb water, and water molecules entering into the photoresist are not easy to volatilize, thereby affecting the bonding force with the encapsulation layer. Furthermore, a part of photoresist will have a poor bonding force with the encapsulation layer due to poor wettability caused by special functional groups on the surface layer, and the poor bonding force therebetween may lead to delamination between the encapsulation layer and the dielectric layer, which affects the reliability of the package and easily produces defective products.

In view of this, it is necessary to provide a new chip packaging structure and a packaging method thereof to solve the aforesaid problems.

SUMMARY

An object of the present disclosure is to provide a chip packaging structure and a packaging method thereof, which can improve the reliability of the chip packaging structure.

In order to achieve the object of the present invention, the following technical solutions are summarized as follows: a chip packaging structure, comprising: a silicon substrate, a passivation layer on a front side of the silicon substrate, a dielectric layer on a front side of the passivation layer, and a encapsulation layer covering at least the sidewall of the silicon substrate, wherein a chip electrode is embedded in the front side of the silicon substrate, the passivation layer and the dielectric layer are respectively provided with a via hole for enabling the chip electrode to be exposed outwardly, and a metal bump is connected to a front side of the chip electrode; the encapsulation layer is joined with the passivation layer at an end proximate to the front side of the silicon substrate.

As a further improved technical solution of the present invention, the passivation layer is provided with a groove around a circumference of the passivation layer, and the end of the encapsulation layer proximate to the front side of the silicon substrate is disposed in the groove.

As a further improved technical solution of the present invention, the passivation layer forming the groove has a thickness of at least 25% of a thickness of the passivation layer mating with the silicon substrate.

As a further improved technical solution of the present invention, the chip packaging structure further comprises a conductive reinforcement layer provided on a back side of the silicon substrate.

As a further improved technical solution of the present invention, the encapsulation layer covers the sidewall and the back side of the silicon substrate.

As a further improved technical solution of the present invention, the chip packaging structure further comprises a first back side protection layer disposed on a back side of the encapsulation layer.

As a further improved technical solution of the present invention, the encapsulation layer covers the sidewall of the silicon substrate, and the chip packaging structure further comprises a second back side protection layer that covers the back side of the silicon substrate and a side of the encapsulation layer proximate to the back side of the silicon substrate.

The present invention further provides a chip packaging method for a chip packaging structure to achieve the aforesaid object, comprising the following steps:

S1: taking a wafer that is provided with a chip electrode and a passivation layer on a front side, wherein the passivation layer is provided with a first via hole for enabling the chip electrode to be exposed outwardly;

S2: forming a dielectric layer on the front side of the wafer covering the wafer, wherein the dielectric layer is provided with a second via hole being provided in a penetrating manner and in communication with the first via hole;

S3: forming a metal bump on a front side of the chip electrode;

S4: bonding a support carrier on the front side of the dielectric layer, the support carrier covering the dielectric layer;

S5: forming a trench and a separated silicon substrate by etching towards the front side of the wafer from a back side of the wafer to the passivation layer;

S6: forming an encapsulation layer on the wafer with trench, wherein the encapsulation layer covers at least the sidewall of the silicon substrate;

S7: removing the support carrier;

S8: form an independent chip packaging structure by cutting along the trench.

As a further improved technical solution of the present invention, the step of forming the trench by etching towards the front side of the wafer from the back side of the wafer to the passivation layer, the etching is performed such that a depth of the passivation layer is not greater than 75% of a thickness of the passivation layer.

As a further improved technical solution of the present invention, the step between S4 and S5 further comprises the following step: thinning the back side of the wafer till the wafer is thinned to a predetermined thickness.

As a further improved technical solution of the present invention, the step between S4 and S5 further comprises the following step: forming a conductive reinforcement layer on the back side of the wafer.

As a further improved technical solution of the present invention, the encapsulation layer formed in S6 encapsulated the exposed sidewall of the silicon substrate; the step between S6 and S7, the packaging method for the chip packaging structure further comprises the following step: forming a second back side protection layer on the back side of the wafer and a side of the encapsulation layer corresponding to the back side of the wafer; or the encapsulation layer formed in S6 encapsulated the exposed sidewall and the back side of the silicon substrate, the step between S6 and S7, the packaging method for the chip packaging structure further comprises the following step: forming a first back side protection layer on the back side of the encapsulation layer.

The present invention has the following beneficial effects. In the chip packaging structure according to the present invention, the encapsulation layer is joined with the passivation layer, which can increase the bonding force between the encapsulation layer and the chip compared with an existing method of joining the encapsulation layer with the dielectric layer, and play a stress buffer role to prevent stress extension. Thus, the encapsulation layer is less likely to fall off under stress. Meanwhile, during the packaging process, the passivation layer enables the chips to be mutually fixed together, which can prevent the chips from being shifted during the encapsulation process, and thereby enhance the reliability of the final product and improve the yield of the final product.

DETAILED DESCRIPTION

Figure 1:
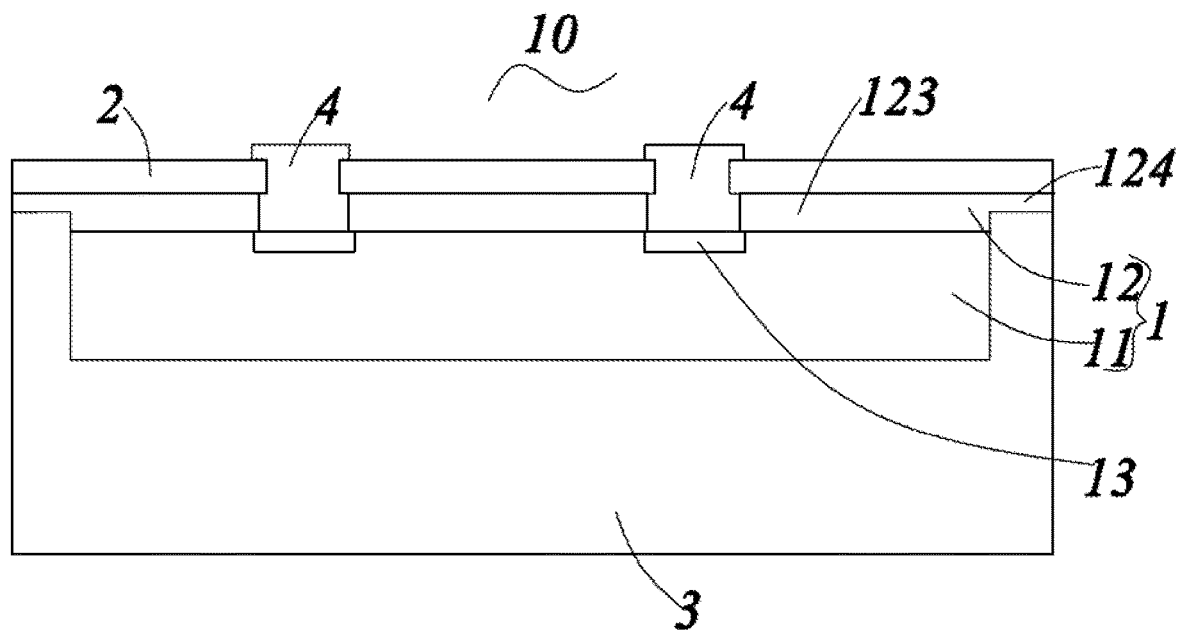
FIG. 1 is a schematic structural diagram of a chip packaging structure according to a first embodiment of the present disclosure.

The present invention will be described hereinafter in detail with reference to the respective embodiments shown in the drawings. Referring to FIG. 1 to FIG. 5i, preferable embodiments of the present invention are shown. However, it shall be noted that the embodiments do not limit the present invention, and the functions, methods, or structural equivalent changes or replacements made by those of ordinary skill in the art according to the embodiments are all included in the protection scope of the present invention.

Figure 5A:
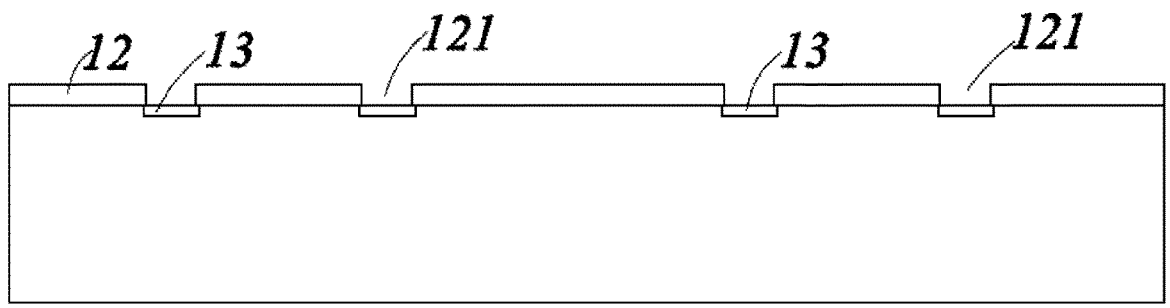
FIGS. 5a-5i are diagrams illustrating steps of a chip packaging method for the chip packaging structure according to the first embodiment of the present disclosure.

Referring to FIG. 1 and in conjunction with FIG. 5a, a chip packaging structure 10 according to a first embodiment of the present invention is shown. The chip packaging structure 10 comprises a chip 1, wherein the chip 1 comprises a silicon substrate 11 and a passivation layer 12 on a front side of the silicon substrate 11. A chip electrode 13 is embedded in the front side of the silicon substrate 11, and the passivation layer 12 is provided with a first via hole 121 for enabling the chip electrode 13 to be exposed outwardly.

The chip packaging structure 10 further comprises a dielectric layer 2 on a front side of the passivation layer 12, and an encapsulation layer 3 covering at least the sidewall of the silicon substrate 11.

Figure 5B:
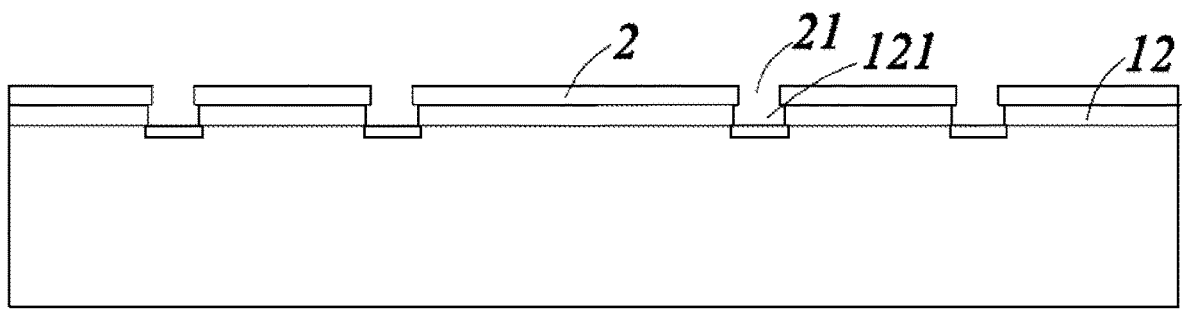
Figure 5C:
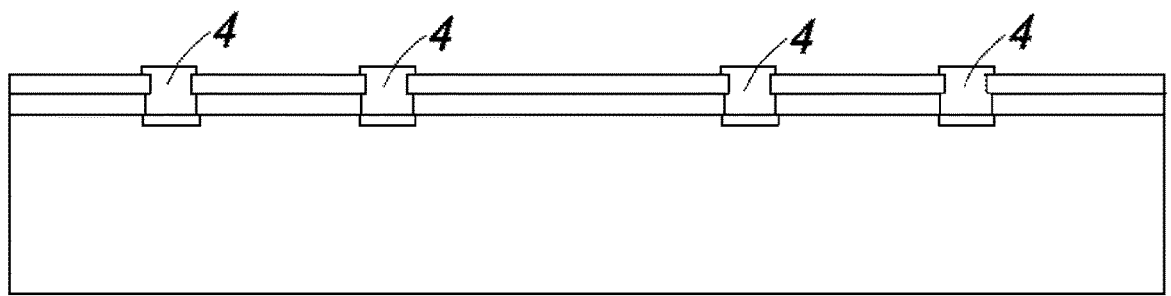
Figure 5D:
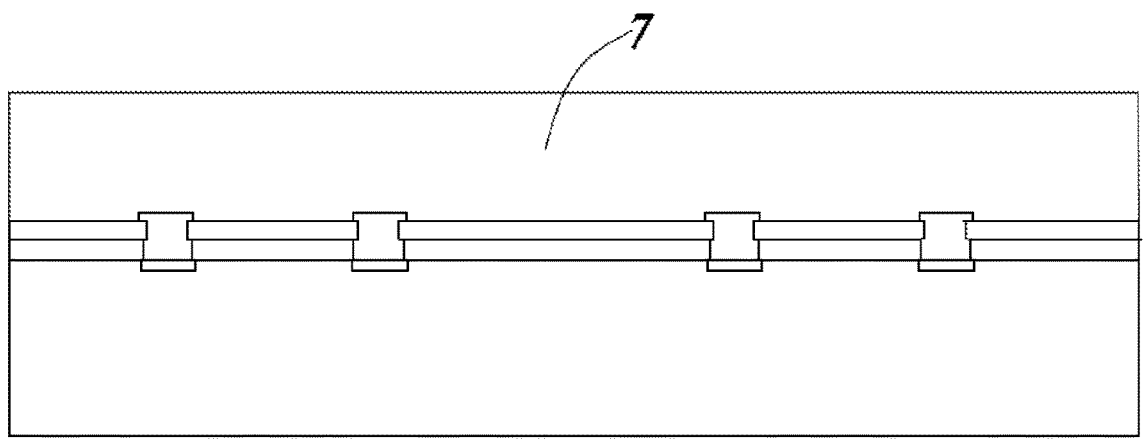
Figure 5E:
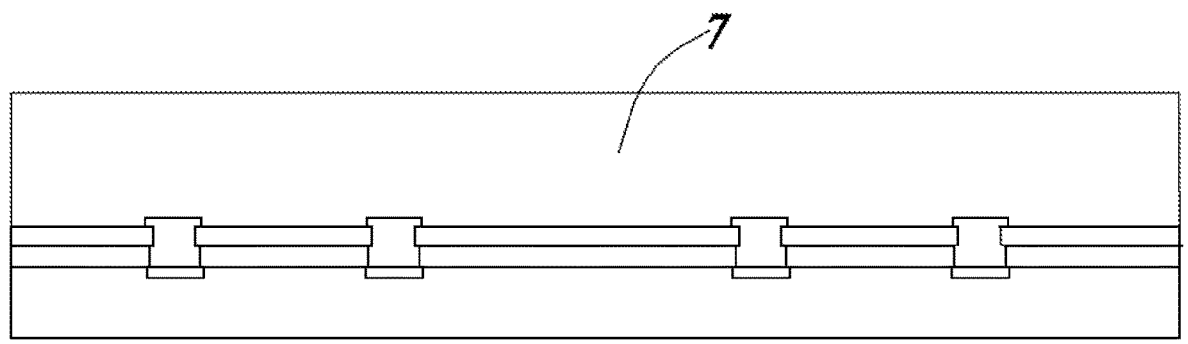
Figure 5F:
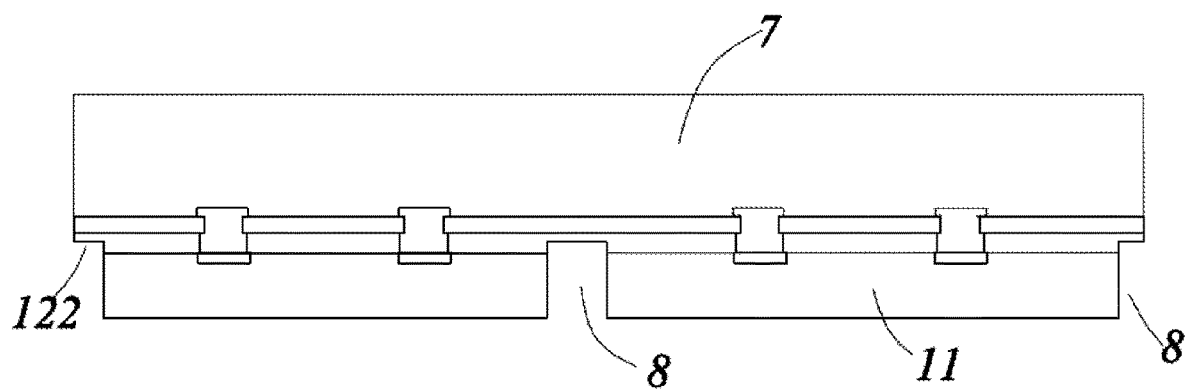
Figure 5G:
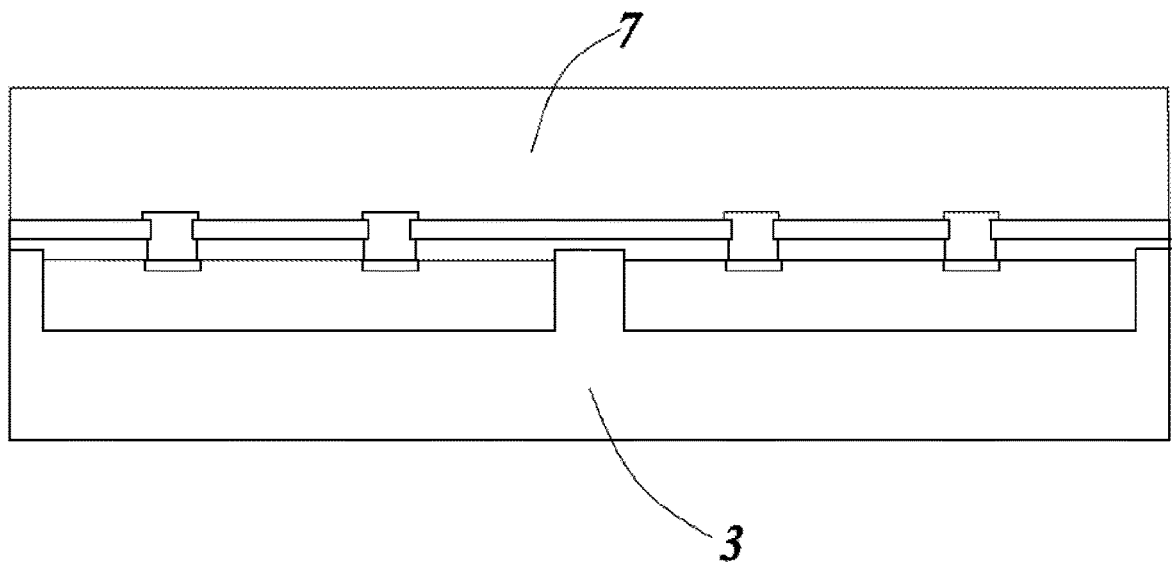
Figure 5H:
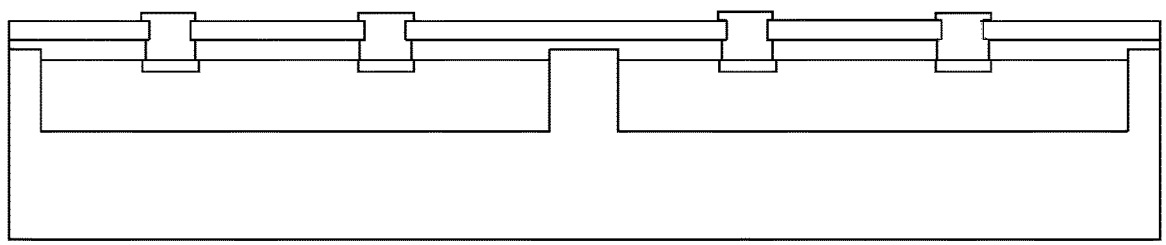

In conjunction with FIG. 5h, the dielectric layer 2 is provided with a second via hole 21 running through the dielectric layer 2 at a position corresponding to the first via hole 121, and the first via hole 121 is in communication with the second via hole 21, such that the front side of the chip electrode 13 is be exposed outwardly.

A metal bump 4 that extends to an outer side of the dielectric layer 2 via the first via hole 121 and the second via hole 21 is connected to a front side of the chip electrode 13, such that the connection and fixation of the chip packaging structure 10 is achieved by the metal bump 4.

Further, the encapsulation layer 3 is joined to the passivation layer 12 at an end approximate to the front side of the silicon substrate 11, and a material of the encapsulation layer 3 is an epoxy resin encapsulation material. On one hand, the passivation layer 12 is formed from an inorganic material such as silicon oxide/silicon nitride that, has a relatively dense structure, and has a small contact area with an external environment and thus has a poor hygroscopicity. On the other hand, the silicon oxide/silicon nitride has a good mechanical property, and is resistant to high temperatures and oxidation. Thus, adhesion between the encapsulation layer 3 and the passivation layer 12 is rather good, which increases the adhesion between the encapsulation layer 3 and the chip 1 compared with an existing method of joining the encapsulation layer 3 with the dielectric layer 2, and plays a stress buffer role to prevent stress extension. Therefore, the encapsulation layer 3 is less likely to fall off under stress, which enhances the reliability of the final product and improve the yield of the final product.

In addition, it shall be understood that, during the process of forming the chip packaging structure 10, the passivation layer 12 enables the chips 1 to be mutually fixed together before encapsulation, which prevents the chips 1 from being shifted during the encapsulation process, improves the reliability of the final product and improves the yield of the final product.

In a specific embodiment, as shown in conjunction with FIG. 5f, a groove 122 is formed in the circumference of the passivation layer 12, and an end of the encapsulation layer 3 approximate to the front side of the silicon substrate 11 is disposed in the groove 122, such that a jointing area between the encapsulation layer 3 and the passivation layer 12 can be increased, the adhesion between the encapsulation layer 3 and the chip 1 is further enhanced, and the reliability of the final product is improved. Of course, the present invention is not limited thereto.

Specifically, the passivation layer 12 comprises an intermediate portion 123 corresponding to the silicon substrate 11, and an edge portion 124 at the circumference of the intermediate portion 123. The groove 122 is formed in the edge portion 124, which means that the encapsulation layer 3 is joined with the edge portion 124.

It shall be understood that in the embodiment where the passivation layer 12 is provided with the groove 122 on the circumference thereof for mating with the encapsulation layer 3, the thickness of the passivation layer 12 in which the groove 122 is formed is less than the thickness of the passivation layer 12 mating with the silicon substrate 11. That is, the thickness of the edge portion 124 is less than the thickness of the intermediate portion 123, and a bottom of a trench as formed while forming the chip packaging structure 10 extends into the passivation layer 12. In an embodiment where the passivation layer 12 is not provided with the groove 122, the edge portion 124 of the passivation layer 12 has the same thickness as the intermediate portion 123.

Furthermore, the thickness of the passivation layer 12 in which the groove 122 is formed is at least 25% of the thickness of the passivation layer 12 mating with the silicon substrate 11, which increases the jointing area between the encapsulation layer 3 and the passivation layer 12, further enhances the bonding force between the encapsulation layer 3 and the chip 1, and improves the reliability of the final product. In addition, the passivation layer 12 enables the chips 1 to be mutually fixed together before the encapsulation, which prevents the chips 1 from being shifted during the encapsulation process.

Furthermore, the encapsulation layer 3 in this embodiment covers the sidewall and the back side of the silicon substrate 11, such that all five sides of the silicon substrate 11 are protected physically and electrically to prevent the sidewall of the chip 1 from contacting the metal bumps 4 on other chips 1 and causing the failure, Thus, interferences from the external environment are prevented, and the reliability is improved. In addition, an insulation protection is provided for the sidewall, such that the sidewall is less likely to generate electric leakage or short circuits, thereby improving the mounting yield of the chip packaging structure 10.

In a specific embodiment, the encapsulation layer 3 is a one-piece structure, of course, is not limited to this.

Figure 2:
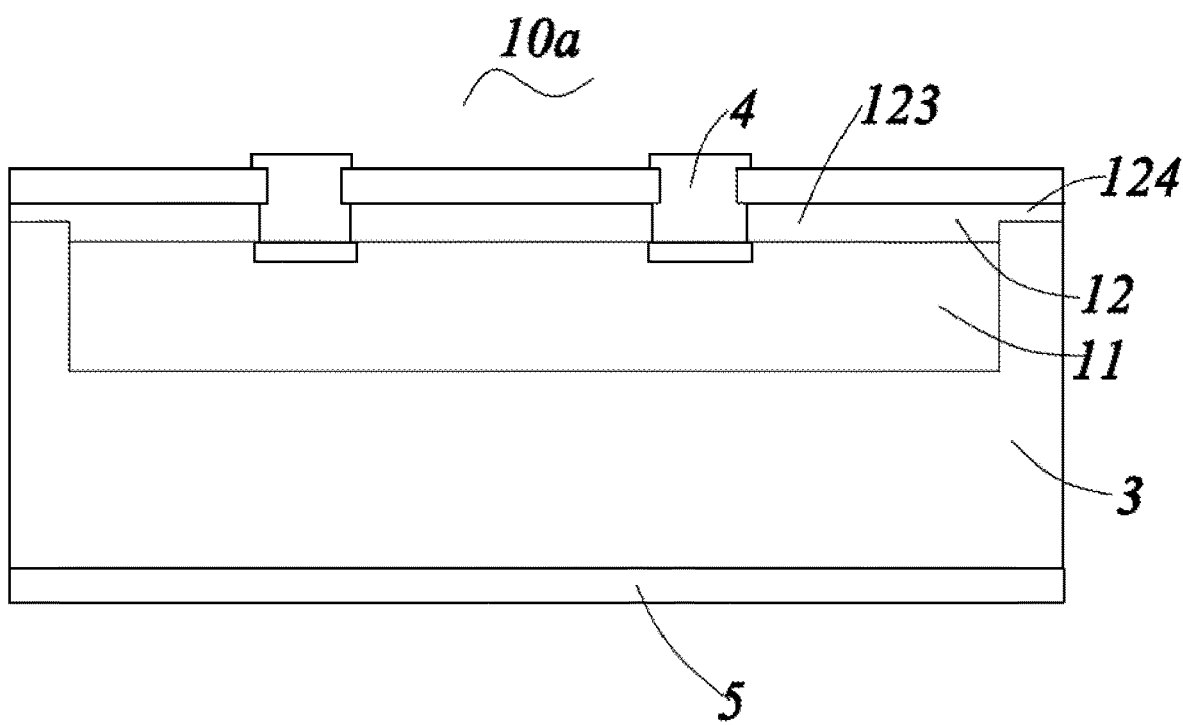
FIG. 2 is a schematic structural diagram of a chip packaging structure according to a second embodiment of the present disclosure.

Furthermore, referring to FIG. 2 for the chip packaging structure 10a according to the second embodiment of the present invention, the difference between this embodiment and the first embodiment lies in that: based on the encapsulation layer 3 that covers the sidewall and the back side of the silicon substrate 11, the chip packaging structure 10a further includes a first back side protection layer 5 on the back side of the encapsulation layer 3 to further improve the reliability of the final product.

The second embodiment of the present invention is the same as the first embodiment except for the aforesaid difference, which will not be repeated herein.

Figure 3:
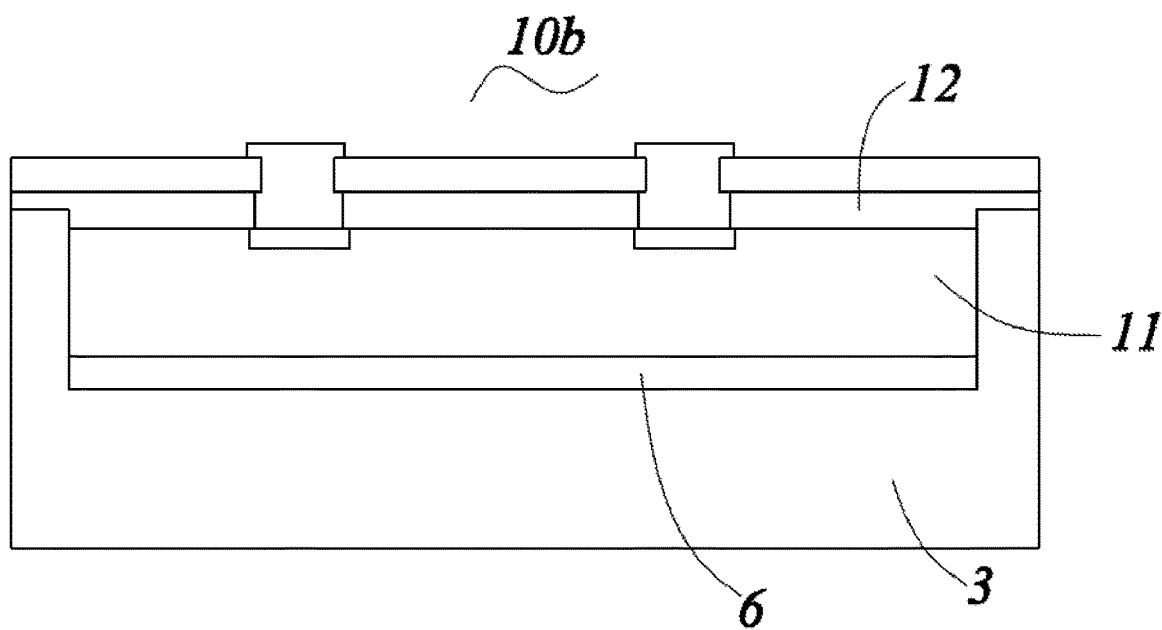
FIG. 3 is a schematic structural diagram of a chip packaging structure according to a third embodiment of the present disclosure.

Referring to FIG. 3 for a chip packaging structure 10b in a third embodiment of the present invention, the difference between this embodiment and the first embodiment lies in that: the chip packaging structure 10b further includes a conductive reinforcement layer 6 on the back side of the silicon substrate 11, such that the overall electric field of the chip packaging structure 10b is uniform.

Specifically, the conductive reinforcement layer may completely cover the back side of the silicon substrate 11, such that the overall electric field of the chip packaging structure 10b is sufficiently uniform. Of course, the conductive reinforcement layer may also partially cover the back side of the silicon substrate 11, such that the material cost is reduced as long as the requirements can be met.

It shall be understood that the encapsulation layer 3 in this embodiment covers the sidewall and the back side of the silicon substrate 11, which means that the encapsulation layer 3 covers the sidewall of the silicon substrate 11 and the back side of the conductive reinforcement layer.

Furthermore, it shall be understood that the chip packaging structure 10b in this embodiment may further include a back side protection layer 5 disposed on the back side of the encapsulation layer 3 according to requirements of the process.

The third embodiment of the present invention is the same as the first embodiment except for the aforesaid difference, which will not be repeated herein.

Figure 4:
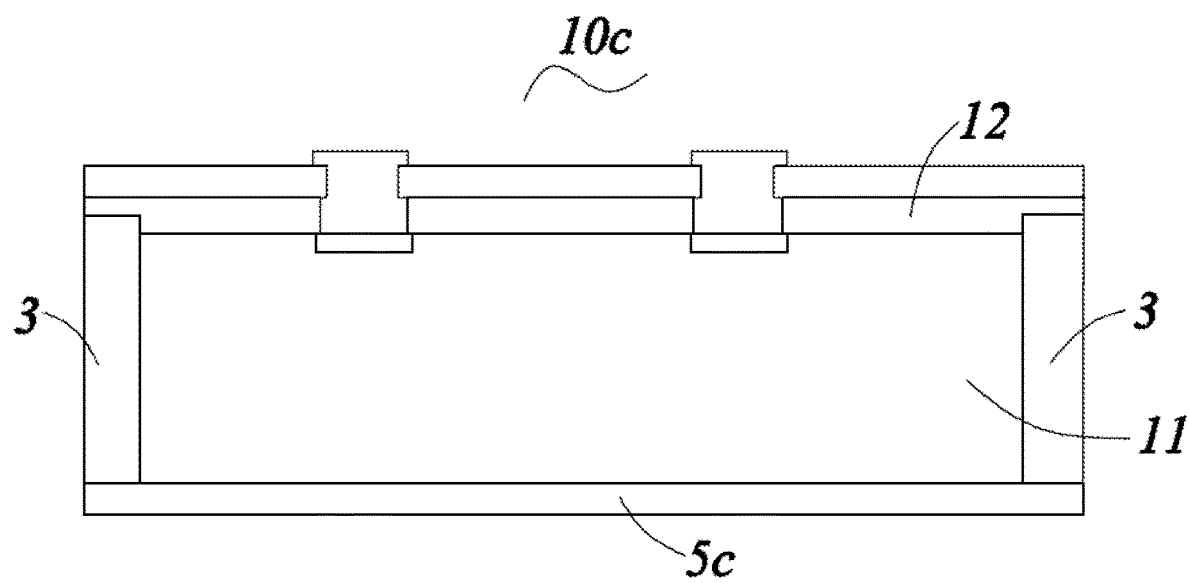
FIG. 4 is a schematic structural diagram of a chip packaging structure according to a fourth embodiment of the present disclosure.

Referring to FIG. 4 for a chip packaging structure 10c according to a fourth embodiment of the present invention, the difference between this embodiment and the first embodiment lies in that: the encapsulation layer 3 merely covers the sidewall of the silicon substrate 11, and the chip packaging structure 10c further comprises a second back side protection layer 5c that covers the back side of the silicon substrate 11 and a side of the encapsulation layer 3 proximate to the back side of the silicon substrate 11.

The fourth embodiment of the present invention is the same as the first embodiment except for the aforesaid difference, which will not be repeated herein.

Furthermore, as shown in FIGS. 5a to 5i, the present invention further provides a chip packaging method for a chip packaging structure, wherein the chip packaging structure is the chip packaging structure 10 according to the first embodiment.

The chip packaging method comprises the following steps S1 to S8.

In S1, as shown in FIG. 5a, a wafer is taken. The wafer has a chip electrode 13 and a passivation layer 12 on a front side, wherein the passivation layer 12 is provided with a first via hole 121 for enabling the chip electrode 13 to be exposed outwardly.

In S2, as shown in FIG. 5b, a dielectric layer 2 covering the wafer is formed on the front side of the wafer. The dielectric layer 2 is provided with a second via hole 21 that runs through the dielectric layer 2 and is in communication with the first via hole 121.

In S3, as shown in FIG. 5c, a metal bump 4 is formed on a front side of the chip electrode 13.

In S4, as shown in FIG. 5d, a support carrier 7 covering the dielectric layer 2 is bonded on the front side of the dielectric layer 2.

In S5, as shown in FIG. 5f, a trench 8 and a silicon substrate 11 separated by the trench 8 are formed by etching towards the front side of the wafer from a back side of the wafer to the passivation layer 12.

In S6, as shown in FIG. 5g, an encapsulation layer 3 is formed on the wafer with the trench 8, and the encapsulation layer 3 covers at least the sidewall of the silicon substrate 11.

In S7, as shown in MG. 5h, the support carrier 7 is removed.

Figure 5I:
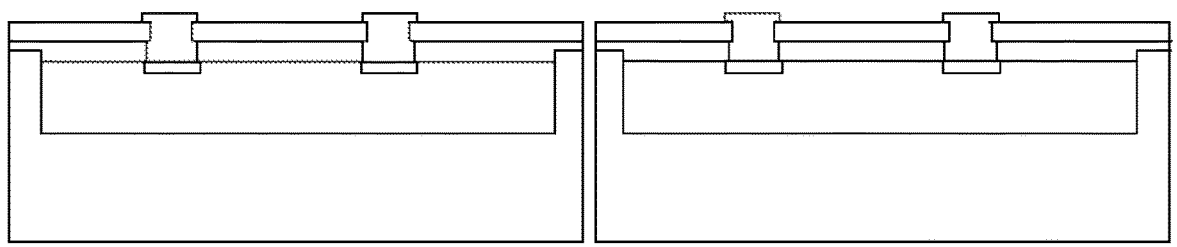

In S8, as shown in FIG. 5i, an independent chip packaging structure 10 is formed by cutting along the trench 8.

Specifically, in S2, the dielectric layer 2 provided with the second via hole 21 may be formed on the front side of the wafer by a photolithography process.

S3 specifically includes the following steps: depositing a metal seed layer on the side of the wafer by a sputtering or electroless plating process; providing a metal pillar on the front side of the chip electrode 13 and a solder layer on the top of the metal pillar sequentially by a photolithography process and an electroplating process; and removing the remaining photoresist, and forming the metal bump 4 by etching away the ineffective metal seed layer outside the metal pillar. That is, the metal bump 4 includes the metal seed layer, the metal pillar, and the solder layer.

S4 specifically includes: connecting the support carrier 7 to the front side of the dielectric layer 2 via a temporary bonding glue or a temporary bonding film.

Specifically, the temporary bonding film may be a temperature-sensitive thermal release film or a UV release film.

The support carrier 7 may be a silicon-based reinforcing plate or a glass-based carrier. By temporarily bonding the support carrier 7 on the dielectric layer 2, the risk of crack during the packaging process can be reduced.

S5 specifically includes: forming the trench 8 by dry etching along a direction of a scribe channel, wherein the bottom of the trench 8 extends to the passivation layer and dividing the wafer into a plurality of silicon substrates 11 that are independent from each other by the trench 8.

In S5, the trench 8 is formed by dry etching, such that a depth of the trench 8 is controllable and may be controlled by controlling the time of the dry etching.

The trench 8 in the present invention does not penetrate through the wafer in a depth direction and extends only to the passivation layer 12, such that the passivation layer 12 enables the chips 1 to be mutually fixed together and prevents the chips 1 from being shifted during the encapsulation process in S6.

According to a specific embodiment, for the step S5 of forming the trench 8 by etching towards the front side of the wafer from the back side of the wafer to the passivation layer 12, the etching is performed such that the depth of the passivation layer 12 is not greater than 75% of a thickness of the passivation layer 12. On one hand, the subsequent jointing area between the encapsulation layer 3 and the passivation layer 12 is increased, the adhesion between the encapsulation layer 3 and the chip 1 is further enhanced, and the reliability of the final product is improved. On the other hand, the passivation layer 12 enables the chips 1 to be mutually fixed together, which prevents the chips 1 from being shifted during the encapsulation process.

Furthermore, as shown in FIG. 5e, the step between S4 and S5 further comprises the following step: thinning the back side of the wafer till the wafer is thinned to a predetermined thickness.

Specifically, the wafer is thinned to the predetermined thickness by thinning the back side of the wafer by means of physical grinding or wet etching.

S6 specifically includes a step of forming the encapsulation layer 3 by encapsulated material with a compression molding process or lamination process in a vacuum environment. The encapsulation layer 3 covers at least the sidewall of the silicon substrate 11.

According to this embodiment, the encapsulation layer 3 in S6 plastically packages the exposed sidewall and back side of the silicon substrate 11, such that all five sides of the silicon substrate 11 are protected physically and electrically to prevent the sidewall of the chip 1 from contacting metal bumps 4 on other chips 1 and causing the failure. Thus, interferences from the external environment are prevented, and the reliability is improved. In addition, an insulation protection is provided for the sidewall, such that the sidewall is less likely to generate electric leakage or short circuits, thereby improving the mounting yield of the chip 1.

Furthermore, when the chip packaging structure is the chip packaging structure 10a according to the second embodiment, the step between S6 and S7, the chip packaging method for the chip packaging structure further comprises the following step: forming a first back side protection layer 5 on the back side of the encapsulation layer 3.

Specifically, the first back side protection layer 5 is formed on the back side of the encapsulation layer 3 by a printing process or a film pasting process.

Furthermore, when the chip packaging structure is the chip packaging structure 10b according to the third embodiment, the step between S4 and S5, the chip packaging method for the chip packaging structure 10b further comprises the following step: forming a conductive reinforcement layer 6 on the back side of the wafer, such that the overall electric field of the chip packaging structure 10b is uniform.

It shall be understood that the method further comprises between S4 and S5 a step of forming a conductive reinforcement layer 6 on the back side of the wafer after performing the thinning process on the back side of the wafer.

Specifically, the conductive reinforcement layer 6 may be implemented by the following procedures: forming a metal seed layer on the back side of the wafer firstly by vapor deposition, and then vaporizing a conductive metal layer on the metal seed layer, or printing a polymeric conductive material or conductive nanomaterial on the back side of the wafer.

Specifically, the conductive reinforcement layer 6 may completely cover the back side of the silicon substrate 11, such that the overall electric field of the chip packaging structure 10b is sufficiently uniform. Of course, the conductive reinforcement layer 6 may also partially cover the back side of the silicon substrate 11, such that the material cost is reduced as long as the requirements can be met.

It shall be understood that, in an embodiment where the conductive reinforcement layer 6 is provided on the back side of the silicon substrate 11, the encapsulation layer 3 encapsulated the back side of the silicon substrate 11 means that the encapsulation layer 3 encapsulated the back side of the conductive reinforcement layer 6.

Furthermore, in a case where the chip packaging structure is the chip packaging structure 10c according to the fourth embodiment, i.e., the encapsulation layer 3 in S6 only covers the sidewall of the silicon substrate 11, the step between S6 and S7, the chip packaging method for the chip packaging structure 10c further comprises the following step forming a second back side protection layer 5c on the back side of the wafer and a side of the encapsulation layer 3 corresponding to the back side of the wafer.

Specifically, the second back side protection layer 5c is formed on the back side of the wafer and on the side of the encapsulation layer 3 corresponding to the back side of the water by a printing process or a film pasting process.

Compared with the prior art, in the chip packaging structure 10 according to the present invention, the encapsulation layer 3 is joined with the passivation layer 12, such that the bonding force between the encapsulation layer 3 and the chip 1 is increased compared with an existing method of joining the encapsulation layer 3 with the dielectric layer 2, thereby playing a stress buffer role to prevent stress extension. Thus, the encapsulation layer 3 is less likely to fall off under stress, Meanwhile, during the encapsulation process, the passivation layer 12 enables the chips 1 to be mutually fixed together, which can prevent the chips 1 from being displaced during the encapsulation process, and thereby enhance the reliability of the final product and improve the yield of the final product.

It should be understood that although the present description is described in terms of embodiments in this description, not every embodiment includes only one independent technical solution. The statement mode of the description is merely for clarity, and those skilled in the art should regard the description as a whole. The technical solutions in various embodiments may also be combined properly to develop other embodiments that can be understood by those skilled in the art.

The series of detailed illustrations listed above are merely for specifically illustrating the feasible embodiments of the present invention, but not intended to limit the protection scope of the present invention. Any equivalent embodiments or variations made without departing from the technical spirit of the present disclosure shall fall within the protection scope of the present disclosure.

What is claimed is:

1. A chip packaging structure, comprising: a silicon substrate, a passivation layer on a front side of the silicon substrate, a dielectric layer on a front side of the passivation layer, and a encapsulation layer covering at least the sidewall of the silicon substrate, wherein a chip electrode is embedded in the front side of the silicon substrate, the passivation layer and the dielectric layer are respectively provided with a via hole for enabling the chip electrode to be exposed outwardly, and a metal bump is connected to a front side of the chip electrode; wherein the encapsulation layer is joined with the passivation layer at an end proximate to the front side of the silicon substrate; the passivation layer is provided with a groove around a circumference of the passivation layer, and the end of the encapsulation layer proximate to the front side of the silicon substrate is disposed in the groove.

2. The chip packaging structure according to claim 1, wherein the passivation layer forming the groove has a thickness of at least 25% of a thickness of the passivation layer mating with the silicon substrate.

3. The chip packaging structure according to claim 1, wherein the chip packaging structure further comprises a conductive reinforcement layer provided on a back side of the silicon substrate.

4. The chip packaging structure according to claim 3, wherein the encapsulation layer covers the sidewall and the back side of the silicon substrate.

5. The chip packaging structure according to claim 4, further comprising: a first back side protection layer disposed on a back side of the encapsulation layer.

6. The chip packaging structure according to claim 1, wherein the encapsulation layer covers the sidewall of the silicon substrate, and the chip packaging structure further comprises a second back side protection layer that covers the back side of the silicon substrate and a side of the encapsulation layer proximate to the back side of the silicon substrate.

7. The chip packaging structure according to claim 1, wherein the encapsulation layer covers the sidewall and the back side of the silicon substrate.

8. A chip packaging method for a chip packaging structure according to claim 1, comprising the following steps:
S1: taking a wafer that is provided with a chip electrode and a passivation layer on a front side, wherein the passivation layer is provided with a first via hole for enabling the chip electrode to be exposed outwardly;
S2: forming a dielectric layer on the front side of the wafer, covering the wafer, wherein the dielectric layer is provided with a second via hole being provided in a penetrating manner and in communication with the first via hole;
S3: forming a metal bump on a front side of the chip electrode;
S4: bonding a support carrier on the front side of the dielectric layer, the support carrier covering the dielectric layer;
S5: forming a trench and a separated silicon substrate by etching towards the front side of the wafer from a back side of the wafer to the passivation layer;
S6: forming an encapsulation layer on the wafer with the trench, wherein the encapsulation layer covers at least the sidewall of the silicon substrate;
S7: removing the support carrier;
S8: form an independent chip packaging structure by cutting along the trench.

9. The chip packaging method for the chip packaging structure according to claim 8, wherein for the step of forming the trench by etching towards the front side of the wafer from the back side of the wafer to the passivation layer, the etching is performed such that a depth of the passivation layer is not greater than 75% of a thickness of the passivation layer.

10. The chip packaging method for the chip packaging structure according to claim 8, wherein the step between S4 and S5 further comprises the following step: thinning the back side of the wafer till the wafer is thinned to a predetermined thickness.

11. The chip packaging method for the chip packaging structure according to claim 8, wherein the step between S4 and S5 further comprises the following step: forming a conductive reinforcement layer on the back side of the wafer.

12. The chip packaging method for the chip packaging structure according to claim 8, wherein the encapsulation layer formed in S6 plastically packages the exposed sidewall of the silicon substrate; the step between S6 and S7, the packaging method for the chip packaging structure further comprises the following step: forming a second back side protection layer on the back side of the wafer and a side of the encapsulation layer corresponding to the back side of the wafer; or the encapsulation layer formed in S6 plastically packages the exposed sidewall and the back side of the silicon substrate, the step between S6 and S7, the packaging method for the chip packaging structure further comprises the following step: forming a first back side protection layer on the back side of the encapsulation layer.

* * * * *